United States Patent
Ku et al.

(10) Patent No.: US 6,323,137 B1
(45) Date of Patent: Nov. 27, 2001

(54) METHOD FOR FORMING AN ARSENIC DOPED DIELECTRIC LAYER

(75) Inventors: Feng-Wei Ku, Taichung; Chia-Lin Ku, Chu-Pei, both of (TW)

(73) Assignee: ProMOS Technologies, Hsinshu (TW)

(*) Notice: Subject to any disclaimer, the term of this patent is extended or adjusted under 35 U.S.C. 154(b) by 0 days.

(21) Appl. No.: 09/518,233

(22) Filed: Mar. 3, 2000

(51) Int. Cl.[7] .................... H01L 21/31; H01L 21/469

(52) U.S. Cl. .................... 438/760; 438/783; 438/784; 438/788

(58) Field of Search .................... 438/760, 783, 438/784, 788

(56) References Cited

U.S. PATENT DOCUMENTS 6,218,319 * 4/2001 Dutron et al. .

* cited by examiner

Primary Examiner—Kevin M. Picardat
Assistant Examiner—D. M. Collins
(74) Attorney, Agent, or Firm—Blakely Sokoloff Taylor & Zafman, LLP

(57) ABSTRACT

A method of forming an arsenic doped oxide layer in a process chamber is disclosed. The method comprises the steps of: setting the process chamber to a temperature of approximately 400–500° C. and a pressure of about 40–250 torr; flowing tetraethylorthosilicate (TEOS) into the process chamber; flowing triethylarsenate (TEAS or TEASAT) into the process chamber; and flowing ozone into the process chamber.

20 Claims, 1 Drawing Sheet

METHOD FOR FORMING AN ARSENIC DOPED DIELECTRIC LAYER

FIELD OF THE INVENTION

The present invention generally relates to semiconductor manufacturing processes, and more particularly, to a method for forming an arsenic doped dielectric layer.

BACKGROUND OF THE INVENTION

Interlayer and intermetal dielectric layers are commonly used to isolate conducting structures, such as metal layers, from subsequently deposited conducting layers. These dielectric layers are also useful in performing a planarization function. Typical prior art processes for forming an interlayer dielectric layer consist of depositing multiple layers of oxide over the underlying metal layer.

One common type of oxide used in the formation process is tetraethylorthosilicate (TEOS, $Si(OC_2H_5)_4$). The TEOS oxide can be deposited in conjunction with a dopant such as arsenic (As) in the form of triethylarsenite (TEAS, $As(OC_2H_5)_3$) to form a doped oxide layer. The doped oxide layer is used as a source for n-type dopants. The process typically is a low pressure chemical vapor deposition (LPCVD) reaction in a batch type furnace. The reaction temperature is around 620° C. at a pressure of about 600 mTorr.

Because the prior art process is done in a batch furnace, thickness and dopant uniformity of the oxide may unacceptably vary from wafer to wafer. Additionally, the process temperature will increase the thermal budget loading for advanced integrated circuits. The process temperature may also result in dopant diffusion to regions outside of the deposited oxide. The elevated process temperature will also cause a higher rate of thermal dissociation of the TEAS relative to the TEOS, resulting in difficulty in controlling doping concentration within the batch. As a related problem, because arsenic is the dopant, the high toxicity of arsenic results in difficulty in safely maintaining and troubleshooting the manufacturing process.

Thus, what is needed is a method of forming doped oxide with greater uniformity of thickness and at a lower temperature.

SUMMARY OF THE INVENTION

A method of forming an arsenic doped oxide layer in a process chamber is disclosed. The method comprises the steps of: setting said process chamber to a temperature of approximately 400–500° C. and a pressure of about 40–250 torr, flowing tetraethylorthosilicate (TEOS) into said process chamber; flowing triethylarsenate (TEAS) into said process chamber; and flowing ozone into said process chamber.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

Figure 1:
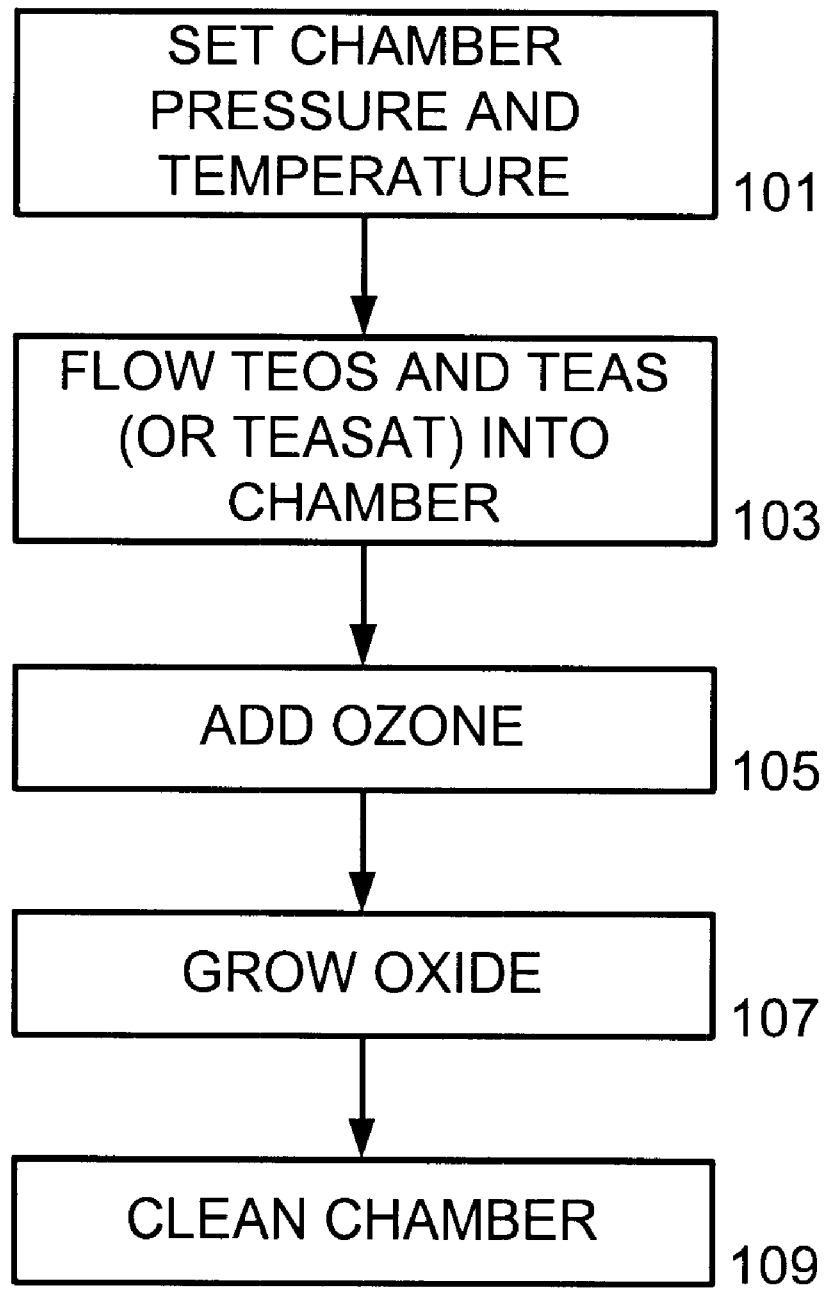
FIG. 1 is a flow diagram illustrating the steps of the present invention.

As noted above, the formation of an arsenic doped oxide involves the dissociation of TEOS and TEAS (or TEASAT, $AsO(OC_2H_5)_3$). TEAS and TEASAT (triethylarsenate) both have the same oxyethyl functional group as TEOS. In the prior art, the reaction takes place in a batch furnace at a temperature of over 620° C. at a pressure of about 600 mTorr.

In accordance with the present invention, arsenic doped oxide can be deposited at a lower temperature and in a single wafer process chamber. For example, the oxide can be deposited using a deposition apparatus manufactured by Silico Valley Group, Inc. Specifically, referring to FIG. 1, a flow chart showing the method of the present invention is provided.

First, at step 101, the pressure and temperature of the process is set in the process chamber. In the preferred embodiment, the pressure is 40–250 torr and the temperature is 400–500° C. Note that the temperature is substantially below that of the prior art process of 620° C. This results in a lower thermal budget and also reduced TEAS (or TEASAT) dissociation.

Next, at step 103, TEOS and TEAS is flowed into the process chamber at a rate of 300–800 sccm for TEOS and 100–300 sccm TEAS. Alternatively, the TEAS may be replaced by TEASAT flowing at a rate of 100–300 sccm. He and $N_2$ are used as a carrier gas flowed at a rate of 2000–6000 sccm.

At step 105, contrary to the established prior art, ozone ($O_3$) is then flowed into the process chamber. The flow rate of the ozone in the preferred embodiment is 4000–6000 sccm. The ozone is added at the same time as the flow of TEOS and TEAS starts. The TEOS and TEAS are reacted to form $SiO_2$, $As_2O_5$ and other by-products under the catalyst of ozone. The arsenic will release when the $As_2O_5$ is heated. Thus, arsenic can act as a doping source. The total reaction time is on the order of 2–5 minutes.

Under the above flow rate, pressure, and temperature conditions, it has been found that arsenic doped oxide is formed on the surface of the wafer in a uniform manner. Thus, at step 107, the oxide is grown. The thickness of oxide is found to be in the range of 250–1000 angstroms. However, depending upon the process, the oxide thickness can be up to 3000 angstroms.

Finally, at step 109, the process chamber is cleaned (after removal of the wafer) using a plasma. Specifically, the cleaning process uses a general plasma. $CF_4$ gas is used to produce plasma at a high frequency of about 13.5 MHz. The length of time for the cleaning process is dependent upon the thickness of the oxide, but preferably is in the range of 30–40 seconds.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an arsenic doped oxide layer in a process chamber, the method comprising:
   setting said process chamber to a temperature of approximately 400–500° C. and a pressure of about 40–250 torr;
   flowing tetraethylorthosilicate (TEOS) into said process chamber;
   flowing TEAS into said process chamber; and
   flowing ozone into said process chamber.

2. The method of claim 1 wherein the flow rate of TEOS is 300–800 sccm, the flow rate of TEAS is 100–300 sccm, and the flow rate of ozone is 4000–6000 sccm.

3. The method of claim 1 wherein said process chamber is a single wafer process chamber.

4. The method of claim 1 wherein the flowing of TEOS, TEAS, and ozone is continued until said arsenic doped oxide layer reaches a thickness of between 250–1000 angstroms.

5. A method of forming an arsenic doped oxide layer in a process chamber, the method comprising the steps of:
- setting said process chamber to a temperature of approximately 400–500° C. and a pressure of about 40–250 torr;
- flowing tetraethylorthosilicate (TEOS) into said process chamber;
- flowing triethyorthosilicate (TEASAT) into said process chamber; and
- flowing ozone into said process chamber.

6. The method of claim 5 wherein the flow rate of TEOS is 300–800 sccm, the flow rate of TEASAT is 100–300 sccm, and the flow rate of ozone is 4000–6000 sccm.

7. The method of claim 5 wherein said process chamber is a single wafer process chamber.

8. The method of claim 5 wherein the flowing of TEOS, TEAS, and ozone is continued until said arsenic doped oxide layer reaches a thickness of between 250–1000 angstroms.

9. A method of forming an arsenic doped oxide layer in a process chamber, the method comprising the steps of:
- setting said process chamber to a predetermined temperature and a predetermined pressure;
- flowing tetraethylorthosilicate (TEOS) into said process chamber;
- flowing TEAS or TEASAT into said process chamber;
- flowing ozone into said process chamber; and
- stopping said flow of TEOS, TEAS or TEASAT, and ozone is continued until said arsenic doped oxide layer reaches a thickness of between 250–1000 angstroms.

10. The method of claim 9 wherein said pressure is between 40–250 torr and said temperature is between 400–500° C.

11. The method of claim 10 wherein the flow rate of TEOS is 300–800 sccm, the flow rate of TEAS or TEASAT is 100–300 sccm, and the flow rate of ozone is 4000–6000 sccm.

12. The method of claim 9 wherein said process chamber is a single wafer process chamber.

13. The method of claim 9 wherein all of said TEOS, TEAS or TEASAT and ozone are flowed into said process chamber simultaneously.

14. The method of claim 12 further including cleaning said process chamber using a plasma.

15. A method of forming an arsenic doped oxide layer in a process chamber, the method comprising the steps of:
- setting said process chamber to a predetermined temperature and a predetermined pressure;
- flowing tetraethylorthosilicate (TEOS) into said process chamber;
- flowing TEAS or TEASAT into said process chamber;
- flowing ozone into said process chamber; and
- stopping said flow of TEOS, TEAS or TEASAT, and ozone after 2–5 minutes.

16. The method of claim 15 wherein said pressure is between 40–250 torr and said temperature is between 400–500° C.

17. The method of claim 16 wherein the flow rate of TEOS is 300–800 sccm, the flow rate of TEAS or TEASAT is 100–300 sccm, and the flow rate of ozone is 4000–6000 sccm.

18. The method of claim 15 wherein said process chamber is a single wafer process chamber.

19. The method of claim 15 wherein all of said TEOS, TEAS or TEASAT and ozone are flowed into said process chamber simultaneously.

20. The method of claim 18 further including cleaning said process chamber using a plasma.

* * * * *